(12) United States Patent
Inoue et al.

(10) Patent No.: US 7,714,236 B2
(45) Date of Patent: May 11, 2010

(54) ELECTRIC COMPONENT

(75) Inventors: Michinobu Inoue, Yokohama (JP);
Susumu Obata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/177,238

(22) Filed: Jul. 22, 2008

(65) Prior Publication Data

US 2009/0025976 A1   Jan. 29, 2009

(30) Foreign Application Priority Data

Jul. 26, 2007 (JP) ............................. 2007-194719

(51) Int. Cl.
*H01L 23/28* (2006.01)

(52) U.S. Cl. ...................... 174/524; 174/561; 174/563; 361/752

(58) Field of Classification Search .................. 174/520, 174/521, 524, 561, 563; 257/787, 704; 361/752
See application file for complete search history.

(56) References Cited

U.S. PATENT DOCUMENTS 4,585,686 A * 4/1986 Hasegawa et al. ............ 428/172
7,078,788 B2 * 7/2006 Vu et al. ...................... 257/668

FOREIGN PATENT DOCUMENTS

| JP | 2005-207959 | | 8/2005 |
| WO | WO 99/43191 | * | 8/1999 |

* cited by examiner

*Primary Examiner*—Hung V Ngo
(74) *Attorney, Agent, or Firm*—Oblon, Spivak, McClelland, Maier & Neustadt, L.L.P.

(57) ABSTRACT

An electric component includes a substrate, a function element provided on the substrate, a first sealing body provided on the substrate to cover the function element at a certain distance, the first sealing body including multiple apertures communicating with an internal space formed between the first sealing body and the substrate, and a second sealing body provided on the first sealing body and configured to occlude the multiple apertures. Here, a boundary between the first sealing body and the substrate is curved in a direction to narrow the internal space.

4 Claims, 12 Drawing Sheets

ELECTRIC COMPONENT

CROSS REFERENCE OF THE RELATED APPLICATION

This application is based on and claims the benefit of priority from Japanese Patent Application No. 2007-194719, filed on Jul. 26, 2007; the entire contents of which are incorporated herein by reference.

BACKGROUND OF THE INVENTION

1. Field of the Invention

The present invention relates to an electric component, or more specifically, to an electric component that includes a function element.

2. Description of the Related Art

Electronic devices such as communication devices that utilize high-frequency bands including microwaves and millimeter waves have been used in a wide range of fields. Accordingly, electric components constituting those electronic devices have been actively manufactured. Such electric components include a micromachine switch to which a micromachine technique is applied, for example.

This electric component includes a mounting substrate, an insulating layer formed on a surface of the substrate, a signal line formed on the substrate with the insulating film interposed therebetween, a function element provided on the substrate so as to stride over the signal line, and a sealing structure formed on the substrate so as to cover the function element with a certain gap. The function element is a movable piece made of a material having a high spring characteristic such as TiN or Al, and is formed into a beam structure supported either on one end or on two ends. This function element functions as a variable electric capacitor or as a switch, which operates in response to a change in a separation distance (a gap) from the signal line.

The sealing structure is a structure configured to seal the function element inside a hollow so as to protect the function element while maintaining an operation thereof. In order to reduce manufacturing costs and to achieve downsizing, this sealing structure is formed as a thin film by a deposition method (a deposition process) (see JP-A No. 2005-207959, for example).

In this process for manufacturing the sealing structure as the thin film, a first sacrificial layer is formed on the substrate so as to form a function element on the substrate with a gap, and then the function element is formed on the first sacrificial layer. Subsequently, a second sacrificial layer is deposited on the first sacrificial layer with the function element interposed therebetween and a first sealing layer (which constitutes a part of the sealing structure) is formed on the second sacrificial layer. During or after this deposition process, multiple apertures are formed on the first sealing film so as to remove the first and second sacrificial layers. Subsequently, an etching material is introduced from the apertures to completely remove the first and second sacrificial layers. Lastly, a second sealing film (a part of the sealing structure) is formed on the first sealing film until the apertures are completely occluded. In this way, the sealing structure is formed of the first sealing film and the second sealing film.

In this manufacturing process, when the second sealing film is formed with the deposition method such as sputtering or vapor deposition, a film material (a sealing material) is deposited immediately below the aperture. For this reason, the aperture is designed to be located away from the function element so as not to deposit the film material on the function element. To obtain this structure, the sealing structure has to be formed more largely than the function element as a whole.

However, as the sealing structure is formed more largely as a whole, an internal space thereof also becomes wider. Accordingly, the volume of the sacrificial layers (the amount of the material for forming the sacrificial layers) is also increased. This requires a longer process time for removing the sacrificial layers and also increases manufacturing time of the electric component.

Moreover, when the area of the apertures is simply increased for reducing the process time for removing the sacrificial layers, process time for closing all the apertures becomes longer with the increase in the area of the apertures and the manufacturing time of the electric component therefore becomes longer.

SUMMARY OF THE INVENTION

An object of the present invention is to provide an electric component with which manufacturing time can be reduced.

A first aspect of the present invention provides an electric component which includes a substrate, a function element provided on the substrate, a first sealing body provided on the substrate to cover the function element at a certain distance, the first sealing body having multiple apertures communicating with an internal space formed between the first sealing body and the substrate, and a second sealing body provided on the first sealing body and configured to occlude the multiple apertures. Here, a boundary between the first sealing body and the substrate is curved in a direction to narrow the internal space.

A second aspect of the present invention provides an electric component which includes a substrate, a function element provided on the substrate, a first sealing body provided on the substrate to cover the function element, the first sealing body having multiple apertures communicating with an internal space formed between the first sealing body and the substrate, and a second sealing body provided on the first sealing body and configured to occlude the multiple apertures. Here, each of the apertures is formed into an elongated aperture shape along a boundary between the first sealing body and the substrate or along a tangent of the boundary.

DESCRIPTION OF THE PREFERRED EMBODIMENTS

First Embodiment

A first embodiment of the present invention will be described with reference to FIGS. 1 to 13.

Figure 1:
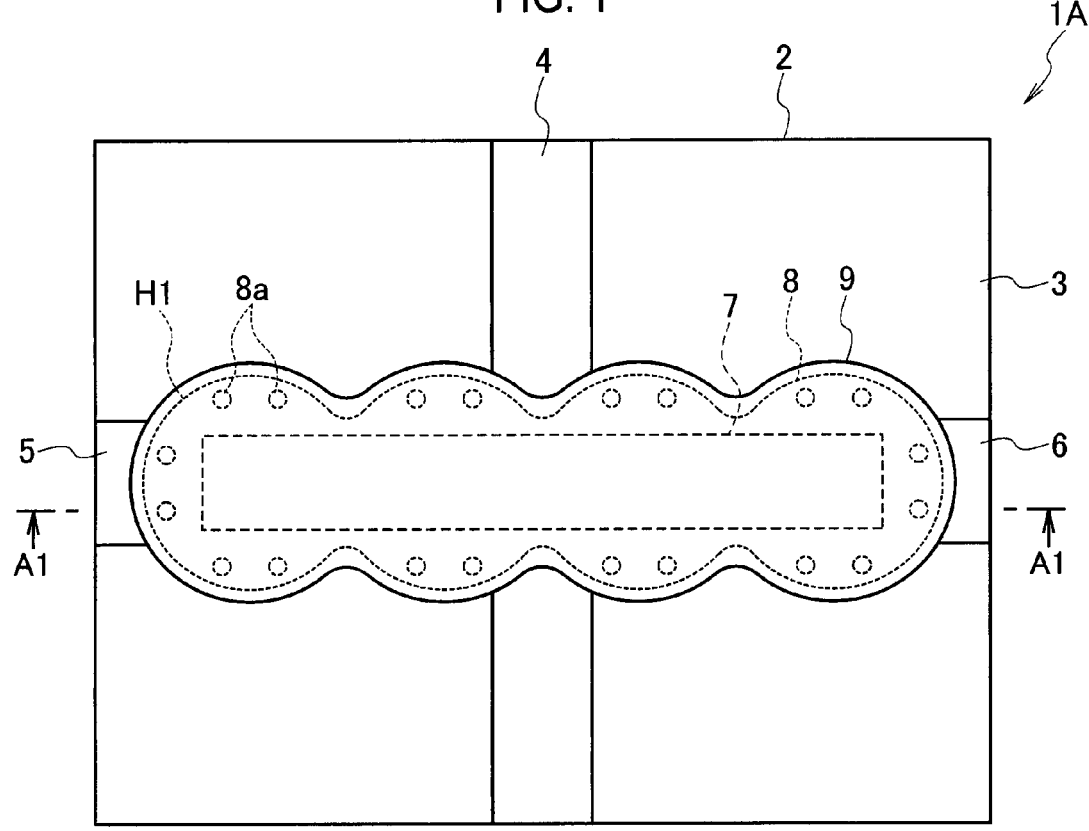
FIG. 1 is a plan view showing a schematic configuration of an electric component according to a first embodiment of the present invention.
Figure 2:
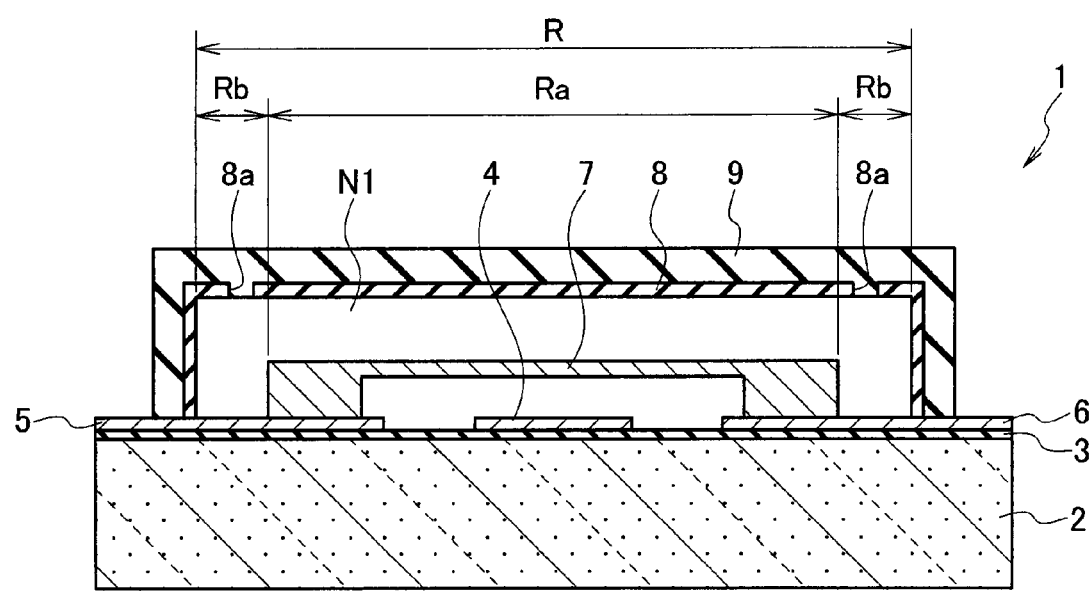
FIG. 2 is a cross-sectional view taking along an A1-A1 line in FIG. 1.

As shown in FIGS. 1 and 2, an electric component 1A according to the first embodiment of the present invention includes a mounting substrate 2, an insulating layer 3 formed on a surface of the substrate 2, a signal line provided on the surface of the substrate 2 with the insulating layer 3 interposed therebetween, a pair of conductors 5 and 6 provided on the substrate 2 with the insulating layer 3 interposed therebetween, a function element 7 connected to those conductors 5 and 6 and provided on the substrate 2 so as to stride over the signal line 4, a first sealing body provided on the substrate 2 so as to cover the function element 7, and a second sealing body 9 provided on the first sealing body 8 so as to cover the first sealing body 8.

The substrate 2 is a substrate made of silicon, for example. Here, instead of the silicon substrate, it is also possible to use a glass substrate, a semi-insulating GaAs substrate, and the like as the substrate 2. The insulating layer 3 is provided on the surface (a mounting surface) of the substrate 2. A silicon oxide film is used for this insulating layer 3, for example.

The signal line 4 is a signal pathway (a transmission pathway) for allowing a passage of a signal, which is linearly provided from one edge (an upper edge in FIG. 1) to the opposite edge (a lower edge in FIG. 1) of the substrate 2. This signal line 4 is made of a material such as Au or Al.

The pair of conductors 5 and 6 are located on both sides in a direction perpendicular to the direction of extension of the signal line 4. Each of the conductors is provided in regions on the substrate 2 away from the signal line 4 by a predetermined distance with the insulating layer 3 interposed between the substrate and the conductor. These conductors 5 and 6 are made of a material such as Au or Al.

The function element 7 is a movable piece formed to be able to move in a direction to approach and recede, facing the signal line 4. This function element 7 is located above the signal line 4 with provision of a separation distance (a gap) equivalent to several micrometers away from the signal line 4, and bridges the pair of conductors 5 and 6. The function element 7 is formed to be able to deform in a direction to approach the signal line 4 due to electric potential supply to the pair of conductors 5 and 6. Specifically, the function element 7 is formed into a flexible plate having a bead structure to be supported on both ends, and is fixed to the pair of conductors 5 and 6. To be more precise, one end of the function element 7 is fixed to the conductor 5 while the other end is fixed to the conductor 6. Here, the function element 7 is electrically connected to the pair of conductors 5 and 6. This function element 7 is made of a metal material having a high spring characteristic, such as TiN or Al.

This function element 7 is deformed in the direction to approach the signal line 4 by a drive force such as an electrostatic force generated by the supply of electric potential to the pair of conductors 5 and 6. At this time, the function element 7 is deformed so at to be bent toward the signal line 4, and thereby approaches the signal line 4. When the drive force is removed, the function element 7 is deformed in the direction to recede from the signal line 4 by resilience attributable to the spring characteristic of the function element 7, and returns to the original position having the predetermined separation distance. In this way, the function element 7 functions as a variable electric capacitor, a switch, or the like by utilizing variation in the separation distance (gap) between the function element 7 and the signal line 4.

The first sealing body 8 is provided on the substrate 2 so as to cover the function element 7 at a certain distance without hampering the operation of the function element 7. This first sealing body 8 includes multiple apertures 8a (see FIG. 2) communicating with an internal space N1 defined between the first sealing body 8 and the substrate 2. These apertures 8a are formed, for example, in a region Rb inside the region R excluding a region Ra opposite to the function element 7, while the region R is opposite to the substrate. The apertures 8a are through holes for introducing an etching material for removing sacrificial layers used in a manufacturing process for the electric component 1A. Twenty pieces of the apertures 8a are formed inside the region Rb along the function element 7, for example. Here, each of the apertures 8a is formed into a circular shape, for example.

The second sealing body 9 is provided on the first sealing body 8 so as to occlude each of the apertures 8a. In this way, the internal space N1 of the first sealing body 8 is completely sealed. This internal space N1 is the space defined by the surface of the substrate 2 (the surface of the insulating layer 3) and an inner surface of the first sealing body 8. Here, when the apertures 8a are occluded with the second sealing body 9, a material for forming the second sealing body 9 (a sealing material) is deposited from the apertures 8a immediately therebelow. However, positioning of the apertures 8a in the region Rb makes it possible to prevent the material for forming the second sealing body 9 from being deposited on the function element 7.

The first sealing body 8 and the second sealing body 9 collectively function as a sealing structure configured to confine the function element 7 in the hollow internal space N1 and to protect the function element 7 in an operable manner. Here, the first sealing body 8 and the second sealing body 9 are formed as thin films in accordance with a deposition method (a deposition process) for the purposes of reduction in manufacturing costs and downsizing, for example.

Figure 3:
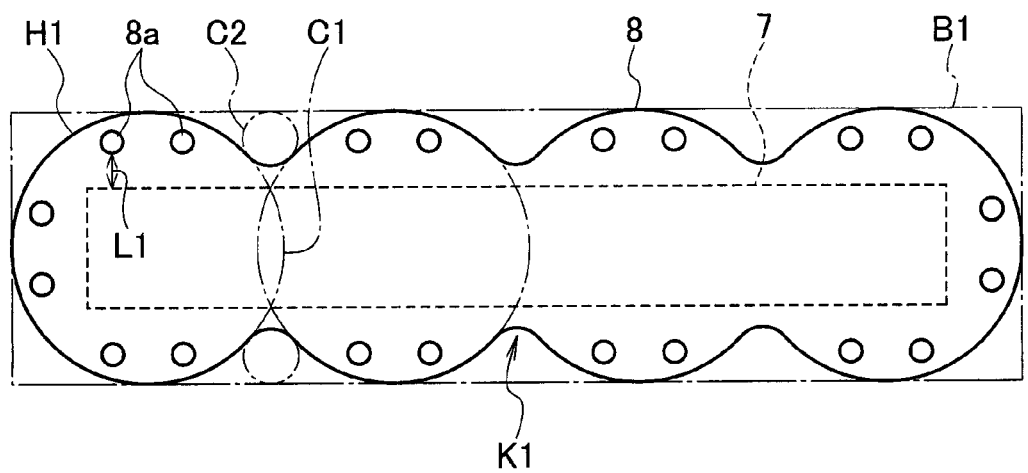
FIG. 3 is a plan view showing a first sealing body included in the electric component shown in FIG. 1.

As shown in FIG. 3, a wall (a wall surface) H1 of the first sealing body 8 is deformed in a direction to narrow the internal space N1 and each of the apertures 8a is located at a separation distance L1 from the opposite region Ra. Specifically, the wall H1 of the first sealing body 8 includes multiple constrictions K1 in a long side direction (a longitudinal direction) of the first sealing body 8. Therefore, the wall surface of the first sealing body 8 is formed into an undulated surface (a corrugated surface) having undulations, for example. In other words, a boundary between the first sealing body 8 and the substrate 2 (a boundary between the wall H1 and the substrate 2) is curved in the direction to narrow the internal space N1. In this way, the wall H1 of the first sealing body 8 is deformed in the direction to narrow the internal space N1.

The constrictions K1 are formed on the first sealing body 8 and each of the apertures 8a is located at a separation distance L1 from the opposite region Ra. The separation distance L1 is defined as a distance enough to avoid deposition of the material for forming the second sealing body 9 on the function element 7. It is preferable to set this distance shorter because it is thereby possible to narrow the internal space N1 of the first sealing body 8. Here, the second sealing body 9 covers the first sealing body 8 so that a wall of the second sealing body 9 is also formed into a shape similar to that of the wall H1 of the first sealing body 8.

Here, in terms of a planar shape of the first sealing body 8, the long side of the first sealing body 8 is formed into a curved line having the wavy undulations and no corners. A short side of the first sealing body 8 is formed into a semicircular shape to eliminate corners of a rectangle. The constriction K1 is formed into a curved shape defined by circumscribing a second precise circle C2 about two first precise circles C1 partially overlapping. Here, a chain line B1 shown in FIG. 1 indicates a first sealing body as a comparative example, which has a rectangular planar shape.

Next, a manufacturing method for the electric component 1A will be described with reference to FIGS. 4 to 7.

Figure 4:
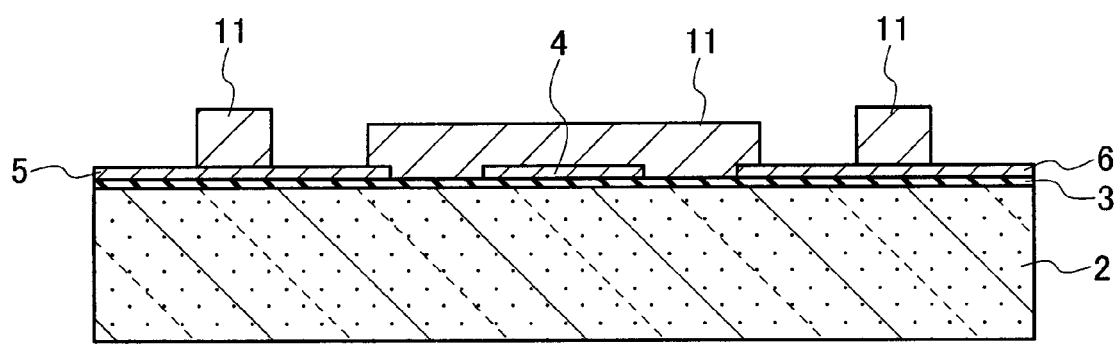
FIG. 4 is a cross-sectional view of a first step for explaining a method of manufacturing of the electric component shown in FIG. 1 and FIG. 2.
Figure 5:
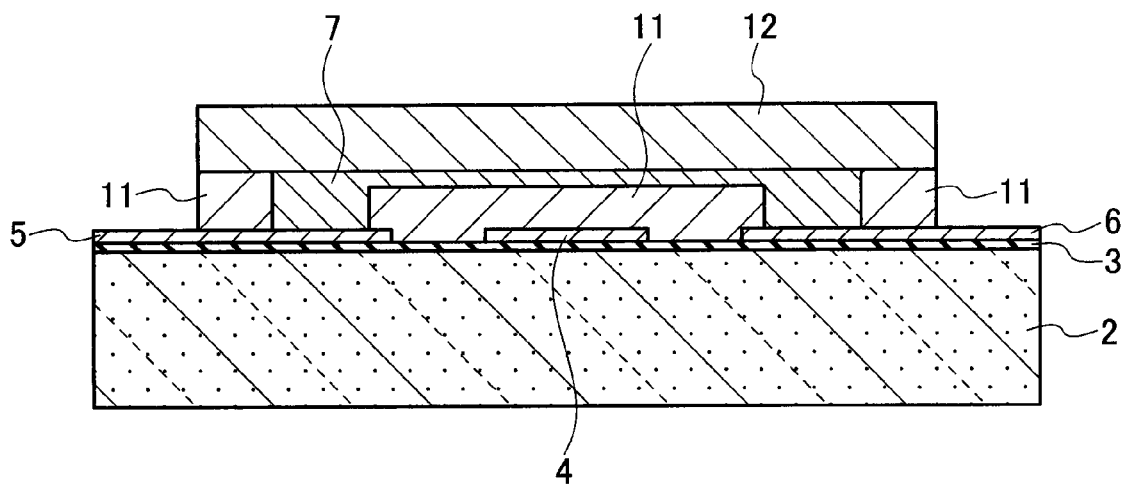
FIG. 5 is a cross-sectional view showing a second step.
Figure 6:
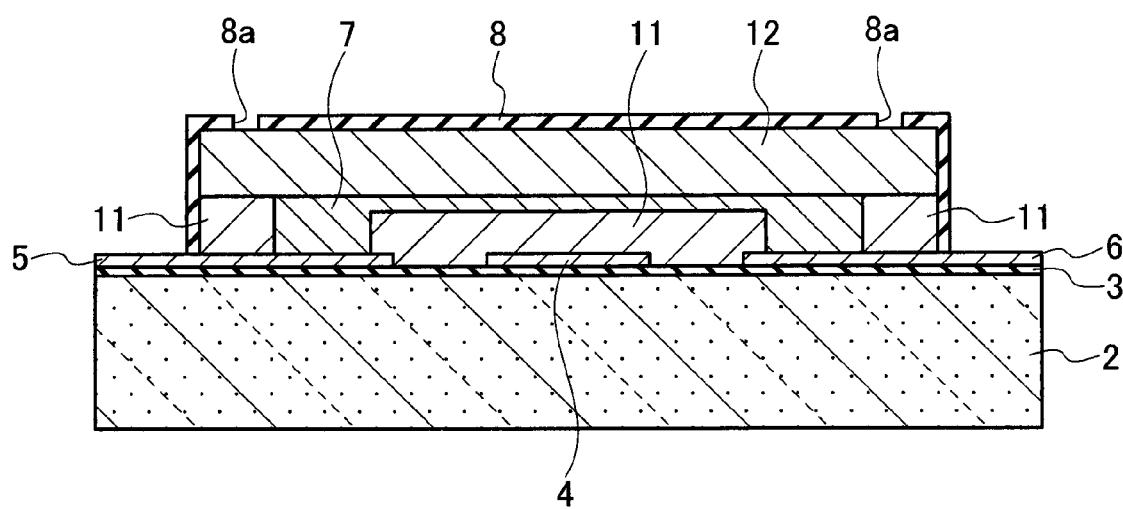
FIG. 6 is a cross-sectional view showing a third step.
Figure 7:
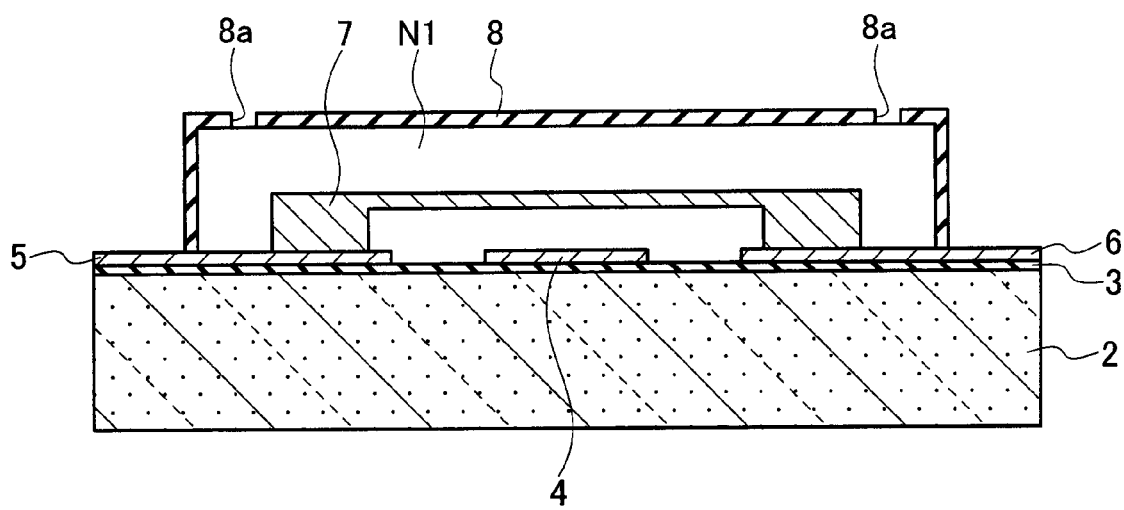
FIG. 7 is a cross-sectional view showing a fourth step.

Manufacturing steps (a manufacturing process) for the electric component 1A includes the steps of preparing the substrate 2, forming the insulating layer 3, the signal line 4, and the pair of conductors 5 and 6 on the substrate 2 and further forming a first sacrificial layer 11 for forming the function element 7 as shown in FIG. 4, forming the function element 7 on the first sacrificial layer 11 and forming a second sacrificial layer 12 on the first sacrificial layer 11 with the function element 7 interposed therebetween as shown in FIG. 5, forming the first sealing body 8 so as to cover the first sacrificial layer 11 and the second sacrificial layer 12 as shown in FIG. 6, removing the first sacrificial layer 11 and the second sacrificial layer 12 after formation of the first sealing body 8 as shown in FIG. 7, and forming the second sealing body 9 on the first sealing body 8 after the removal so as to cover the first sealing body 8. These steps are carried out and the electric component 1A as shown in FIGS. 1 and 2 is finished.

First, the substrate 2 is prepared in the preparing step. A silicon substrate is used for the substrate 2, for example. Instead, it is also possible to use an insulative substrate or semiconductor substrate as the substrate 2. For example, it is possible to use a glass substrate, a sapphire substrate, and the like.

In the next step, as shown in FIG. 4, the insulating layer 3 is formed on the entire surface of the substrate 2. Then the signal line 4 and the pair of conductors 5 and 6 are formed on the insulating layer 3. Thereafter, the first sacrificial layer 11 for forming the function element 7 is formed on the insulating layer 3 with the signal line 4 and the pair of conductors 5 and 6 interposed therebetween. Here, the signal line 4 and the pair of conductors 5 and 6 are formed in accordance with a formation process including the following: forming a conductive layer on the entire surface of the insulating layer 3 by using a material such as Au; forming a photoresist film for patterning on the conductive layer; and then performing etching. The first sacrificial layer 11 is also formed by use of a material such as aluminum by the same process as this formation process.

In the next step, as shown in FIG. 5, the function element 7 is formed on the first sacrificial layer 11 and then the second sacrificial layer 12 is formed on the first sacrificial layer 11 with the function element 7 interposed therebetween. Here, the function element 7 is formed in accordance with a formation process including the following: forming a metal layer on the entire surface of the substrate 2 by using a material such as TiN or Al; forming a photoresist film for patterning on the metal layer; and then performing etching. The second sacrificial layer 12 is also formed by use of a material such as aluminum by to the same process as this formation process.

In the next step, as shown in FIG. 6, the first sealing body 8 is formed as a thin film on outer surfaces of the first sacrificial layer 11 and the second sacrificial layer 12 by CVD (chemical vapor deposition), PVD (physical vapor deposition) or the like, and then the apertures 8a are formed on the first sealing body 8. Here, the apertures 8a are formed either during or after the deposition of the first sealing body 8. When the sealing is achieved by the CVD in this process, the pressure inside the internal space (the hollow) N1 is set to a vacuum pressure in a range from about 1 Pa to 100 Pa which is equivalent to an ambient pressure at the time of deposition. When the sealing is achieved by sputtering, the pressure inside the internal space is approximately equal to 0.3 Pa which is equivalent to an ambient pressure at the time of deposition.

In the next step, as shown in FIG. 7, an etching material for removing the sacrificial layers is introduced from the apertures 8a to remove the first sacrificial layer 11 and the second sacrificial layer 12. Here, an acidic etchant is used for the etching material, for example. Thereafter, the second sealing body 9 is formed as a thin film on the first sealing body 8 by the CVD, the PVD or the like. At this time, the apertures 8a on the first sealing body 8 are occluded by the second sealing body 9. In this way, the electric component 1A as shown in FIGS. 1 and 2 is finished.

In this manufacturing process, the wall H1 of the first sealing body 8 is deformed in the direction to narrow the internal space (the hollow) N1 and each of the apertures 8a is located at a separation distance L1 from the opposite region Ra. In this way, the volumes of the first sacrificial layer 11 and the second sacrificial layer 12 become smaller. Therefore, it is possible to reduce process time for removing the sacrificial layers 11 and 12. In this way, it is possible to reduce manufacturing time of the electric component 1A and moreover to suppress manufacturing costs thereof. In addition, it is possible to manufacture the electric component 1A having the sealing structure easily by use of the existing semiconductor manufacturing process as described above.

Note that the pressure inside the internal space (the hollow) K1 becomes lower than an atmospheric pressure when the sealing structure is formed by a process to be conducted in a reduced pressure chamber. Accordingly, a pressure difference between the atmosphere and the hollow reacts as a load on the sealing structure (a sealing film). A larger sealing structure than the function element 7 increases this effect, and in some cases, the sealing structure may contact the function element 7 as a result of significant deformation or may be broken. To avoid such problems, the function element 7 is sealed by the highly rigid sealing structure due to the constrictions K1 provided for the sealing structure. In this way, even in the case of the relatively thin structure having the apertures 8a, it is possible to suppress deformation attributable to the pressure difference relative to the atmosphere.

As described above, according to the first embodiment of the present invention, the boundary between the first sealing body 8 and the substrate 2 is curved in the direction to narrow the internal space N1 which is defined by the surface of the substrate 2 and the inner surface of the first sealing body 8, and the wall (the wall surface) H1 of the first sealing body is deformed in the direction to narrow the internal space N1. Therefore, the volumes of the first sacrificial layer 11 and the second sacrificial layer 12 are reduced. In this way, it is possible to reduce the process time for removing the sacrificial layers 11 and 12 and thereby to reduce the manufacturing time for the electric component 1A. Moreover, it is possible to reduce the manufacturing costs.

In addition, since the wall H1 of the first sealing body 8 includes at least one constriction K1 in the longitudinal direction (the long side direction) of the first sealing body 8, it is possible to improve deformation strength. Moreover, it is possible to further suppress an amount of displacement by increasing the number of the constrictions K1. Accordingly, it is possible to further improve the deformation strength. As a result, it is possible to avoid defects such as cracks or breakage on the first sealing body 8 (the sealing structure) occurring during the manufacturing process, and thereby to manufacture the electric component 1A stably. In particular, since the wall H1 of the first sealing body 8 is formed into the undulated shape, it is possible to reduce the volumes of the first sacrificial layer 11 and the second sacrificial layer 12 and thereby to reduce the process time for removing the sacrificial layers 11 and 12 reliably.

Now, modified examples concerning the shape of the wall H1 of the first sealing body 8 will be described with reference to FIGS. 8 to 12. Note that a chain line B1 illustrated in FIGS. 8 to 11 shows the first sealing body of the comparative example having the rectangular planar shape.

Figure 8:
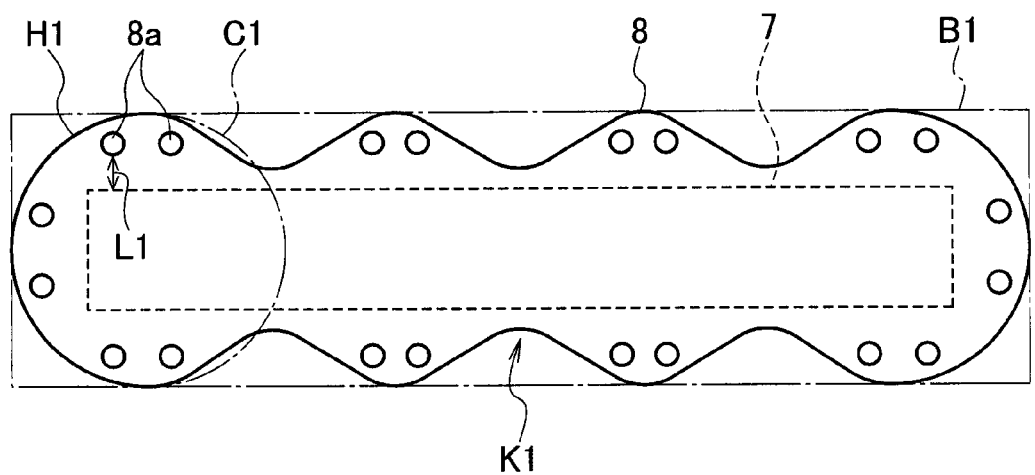
FIG. 8 is a plan view showing a first sealing body of a first modified example.

As shown in FIG. 8, in terms of the planar shape of the first sealing body 8 of a first modified example, each long side of the first sealing body 8 is formed into a curved line having wavy undulations without corners, i.e. in a sinusoidal wave form. Each short side of the first sealing body 8 is formed into a semi-circular shape so as to eliminate corners of the rectangle. Here, the apertures 8a are repeatedly provided in the long side direction in conformity to the sinusoidal waveform of the first sealing body 8.

Figure 9:
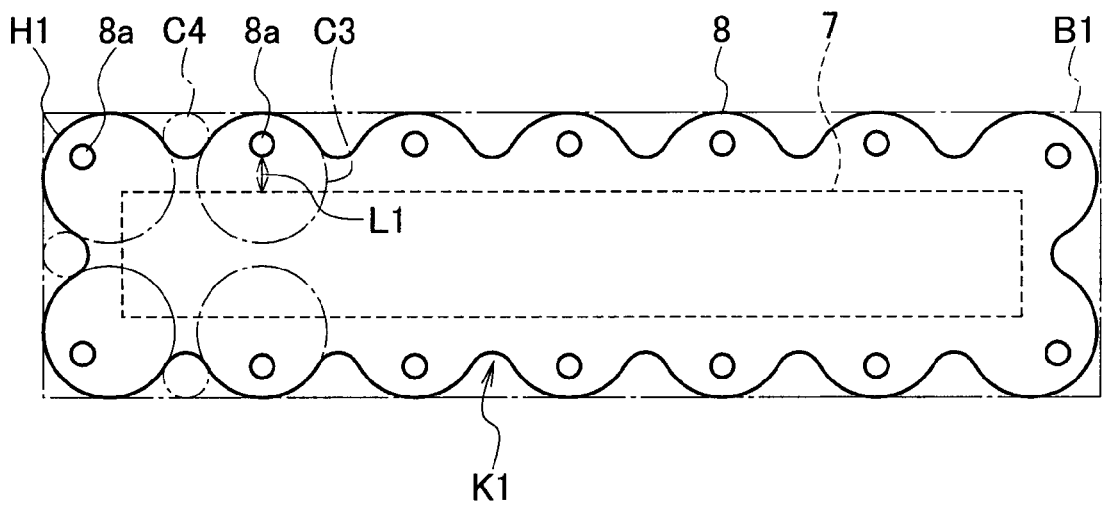
FIG. 9 is a plan view showing a first sealing body of a second modified example.

As shown in FIG. 9, in the first sealing body 8 of a second modified example, the number of the apertures 8a is reduced from 20 pieces to 14 pieces as compared to FIGS. 3 and 8. Meanwhile, the number of the constrictions K1 in the long side direction is increased from 3 pieces to 6 pieces and one constriction K1 is also provided in the short side direction of the first sealing body 8. In terms of the planar shape of the first sealing body 8, each long side of the first sealing body 8 is formed into a curved line having wavy undulations (more undulations as compared to FIGS. 3 and 8) without corners. Each short side of the first sealing body 8 is also formed into a curved line having wavy undulations without corners. Moreover, the constriction K1 is formed into a curved shape defined by circumscribing a fourth precise circle C4 about two third precise circles C3 partially overlapping and having smaller diameters as compared to FIG. 3. Here, the apertures 8a are repeatedly provided in the long side direction and in the short side direction in the long side direction in conformity to the sinusoidal waveform of the first sealing body 8. In this second modified example, increase of the number of the constrictions K1 from three pieces to six pieces causes the curvature of the curved shape to be reduced, thereby enhancing a reduction effect to reduce deformation such as flexure as compared to FIGS. 3 and 6. Here, the amplitudes of the curved lines are the same in FIGS. 3, 8, and 9.

Figure 10:
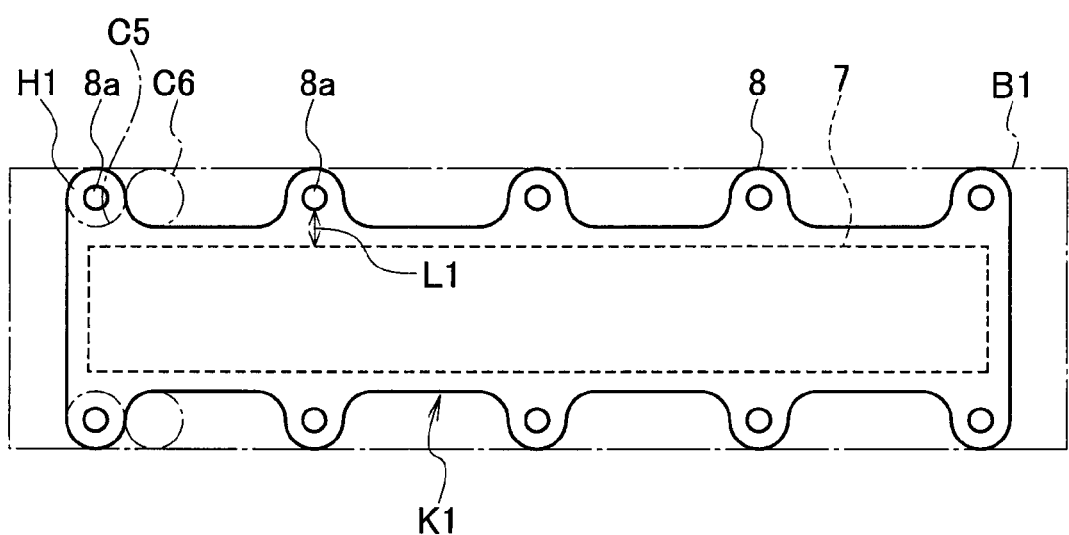
FIG. 10 is a plan view showing a first sealing body of a third modified example.

As shown in FIG. 10, in the first sealing body 8 of a third modified example, the number of the apertures 8a is reduced from 20 pieces to 10 pieces as compared to FIGS. 3 and 8. Meanwhile, the number of the constrictions K1 is increased from 3 pieces to 4 pieces and each of the constrictions K1 is constricted toward the function element 7 as much as possible to the extent that the operation thereof is not hampered. In this way, the apertures 8a are provided in protrusions of the first sealing body 8. Moreover, the constriction K1 is formed into a shape including a curved line defined by circumscribing a sixth precise circle C6 about two fifth precise circles C5 partially overlapping and having the same diameter and a straight line as those of the sixth precise circle C6. In this third modified example, the constriction K1 has a wider range than in FIGS. 3, 8, and 9. Accordingly it is possible to obtain a greater reduction effect to reduce deformation such as flexure. Moreover, since the internal space N1 of the first sealing body 8 becomes narrower, it is possible to reduce the process time for removing the sacrificial layers 11 and 12.

Figure 11:
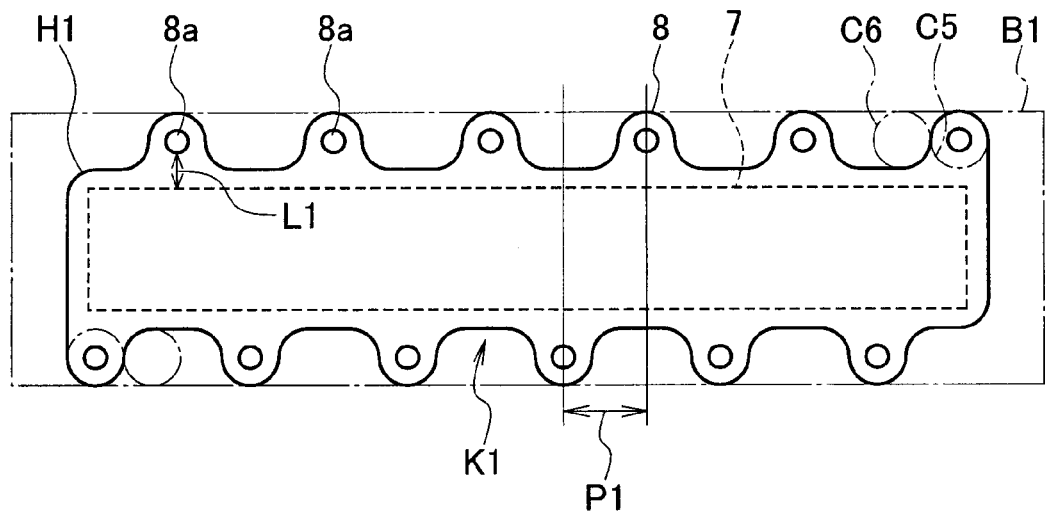
FIG. 11 is a play view showing a first sealing body of a fourth modified example.
Figure 12:
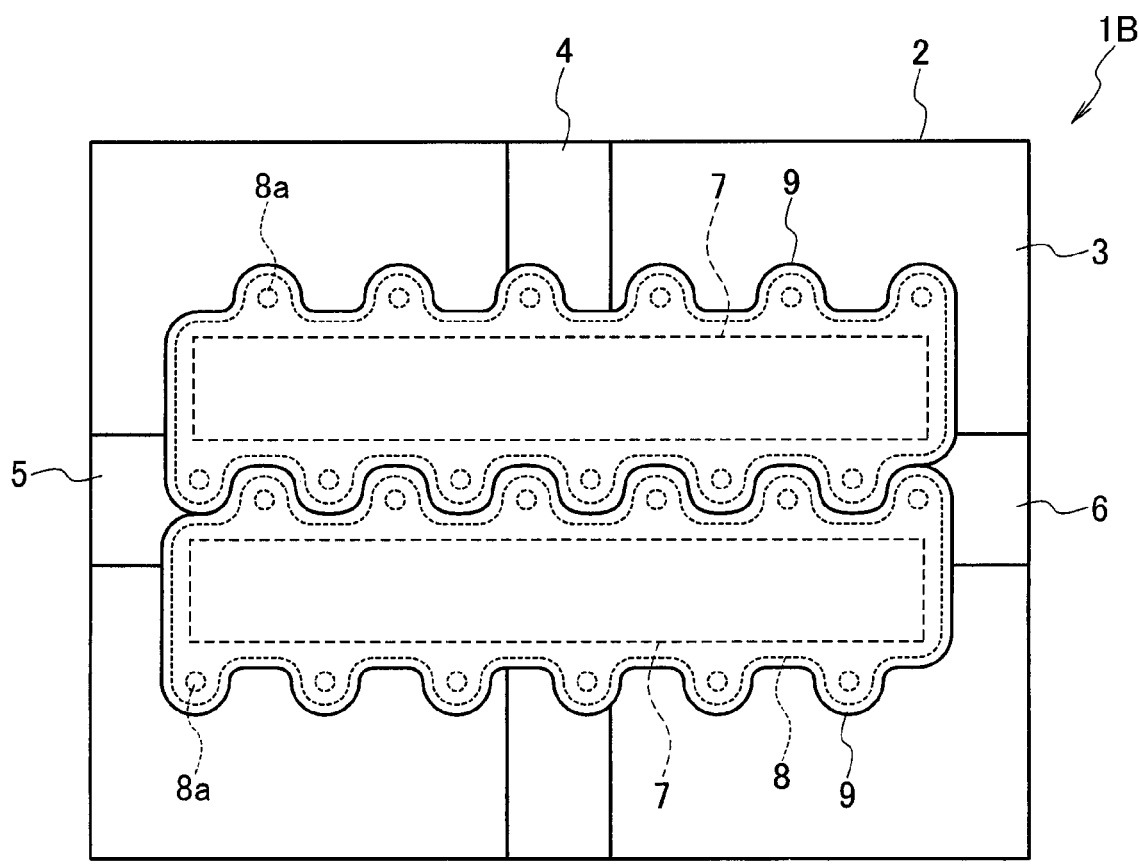
FIG. 12 is a plan view showing a schematic configuration of an electric component including multiple first sealing bodies shown in FIG. 11.

As shown in FIG. 11, in the first sealing body 8 of a fourth modified example, the number of the apertures 8a is increased from 10 pieces to 12 pieces as compared to FIG. 10. Meanwhile, the number of the constrictions K1 is increased from 4 pieces to 5 pieces and each of the constrictions K1 is constricted toward the function element 7 as much as possible to the extent that the operation thereof is not hampered. In this way, the apertures 8a are provided in protrusions of the first sealing body 8 as in FIG. 10. Moreover, each of the constrictions K1 is repeatedly provided in positions opposite to the protrusion by means of slide traveling at a predetermined pitch P1 in the long side direction of the first sealing body 8. In this way, the constrictions K1 are located in asymmetric positions with respect to the longitudinal center axis of the function element 7. In this fourth modified example, the reduction effect to reduce deformation such as flexure becomes greater than in FIGS. 3, 8, and 9. Moreover, since the internal space N1 of the first sealing body 8 becomes narrower, it is possible to reduce the process time for removing the sacrificial layers 11 and 12. In addition, when the function elements 7 are provided in parallel and the function elements 7 are sealed by the first sealing bodies 8 and the second sealing bodies 9 (the sealing structures) in an electric component 1B as shown in FIG. 12, it is possible to provide the sealing bodies so as to engage the constrictions K1 on one of the sealing structures with the protrusions on the other sealing structure. Accordingly, it is possible to reduce a mounting area of the function elements 7, i.e. the sealing structures, and as a result, the electric component 1B can be downsized.

Figure 13:
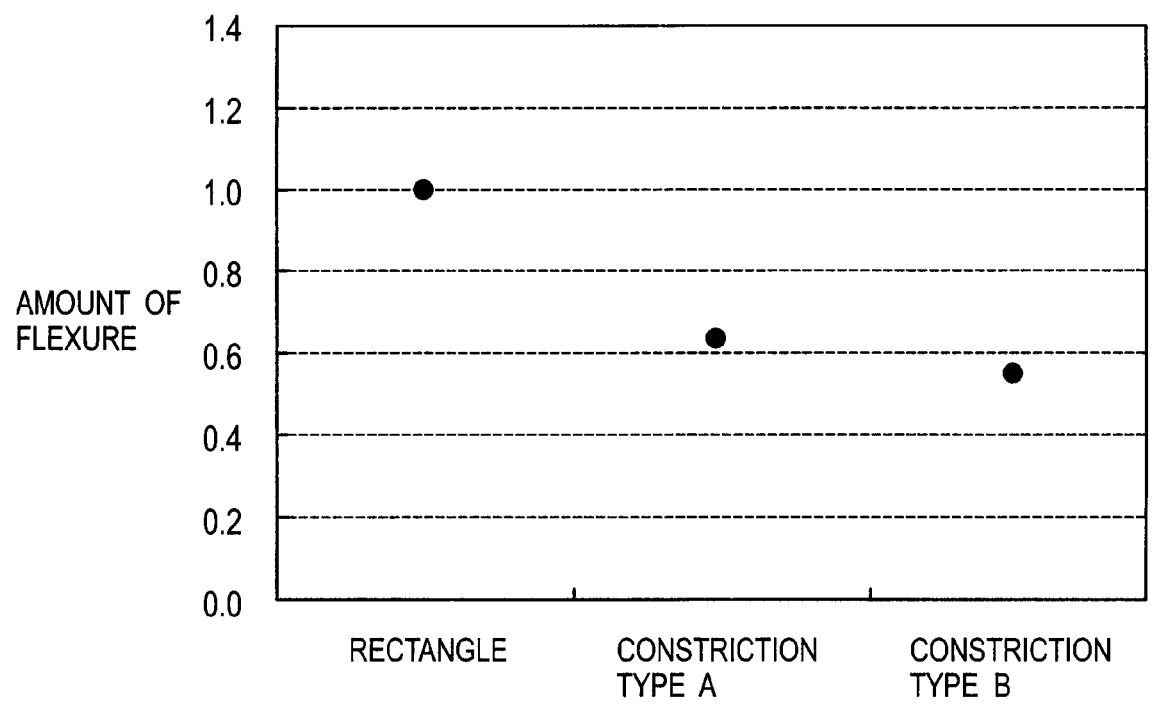
FIG. 13 is a view for explaining a simulation result of a deformation characteristic of a sealing structure according to the first embodiment of the present invention.

Here, a deformation characteristic of the sealing structure having the constrictions K1 is simulated. Results are shown in FIG. 13. FIG. 13 shows amounts of flexure of the sealing structures having different shapes. Specifically, FIG. 13 shows the amounts of flexure of the sealing structure having the rectangular planar shape (rectangle: the comparative example), the sealing structure having the three constrictions K1 in the long side direction (constriction type A: see FIG. 3), and the sealing structure having the six constrictions K1 in the long side direction and the single constriction K1 in the short side direction (constriction type B: see FIG. 9), respectively. The amount of flexure means an amount of deformation of an upper surface of the sealing film (the sealing structure) toward the hollow due to vacuum sealing. In FIG. 13, the amount of flexure of the sealing structure having the rectangular planar shape is defined as 1. The simulation is carried out under the condition that the hollow of each of the sealing films is set to vacuum and the pressure difference of about 0.1 kPa relative to the atmosphere is applied to an inner wall of the sealing film. Meanwhile, the sealing films are made of the same material, and have the same thickness, and sealing heights.

As a result of this simulation, it is apparent that the respective amounts of flexure of the sealing structure (of the constriction type A) having the three constrictions K1 in the long side direction and the sealing structure (of the constriction type B) having the six constrictions K1 in the long side direction and the single constriction K1 in the short side direction are reduced to about 0.6 which represents reduction by approximately 40% as compared to the sealing structure (of the rectangle) having the rectangular planar shape. As described above, it is possible to improve the deformation strength by providing the constrictions K1. Moreover, it is possible to suppress the amount of flexure more efficiently by increasing the number of the constrictions K1. Hence it is possible to further improve the deformation strength.

Here, the constrictions K1 are formed on the first sealing body 8. However, the present invention is not limited only to this configuration. For example, it is also possible to provide the first sealing body 8 with concave portions which represent the features of the constrictions K1 on one side. That is, it is also possible to form only one side of the wall of the first sealing body 8 into the undulated shape.

Second Embodiment

A second embodiment of the present invention will be described with reference to FIGS. 14 to 18.

Basically, the second embodiment of the present invention is similar to the first embodiment. Therefore, different features from those in the first embodiment will be described in the second embodiment. Moreover, in the second embodiment, explanation of the same constituents as those described in the first embodiment will be omitted.

Figure 14:
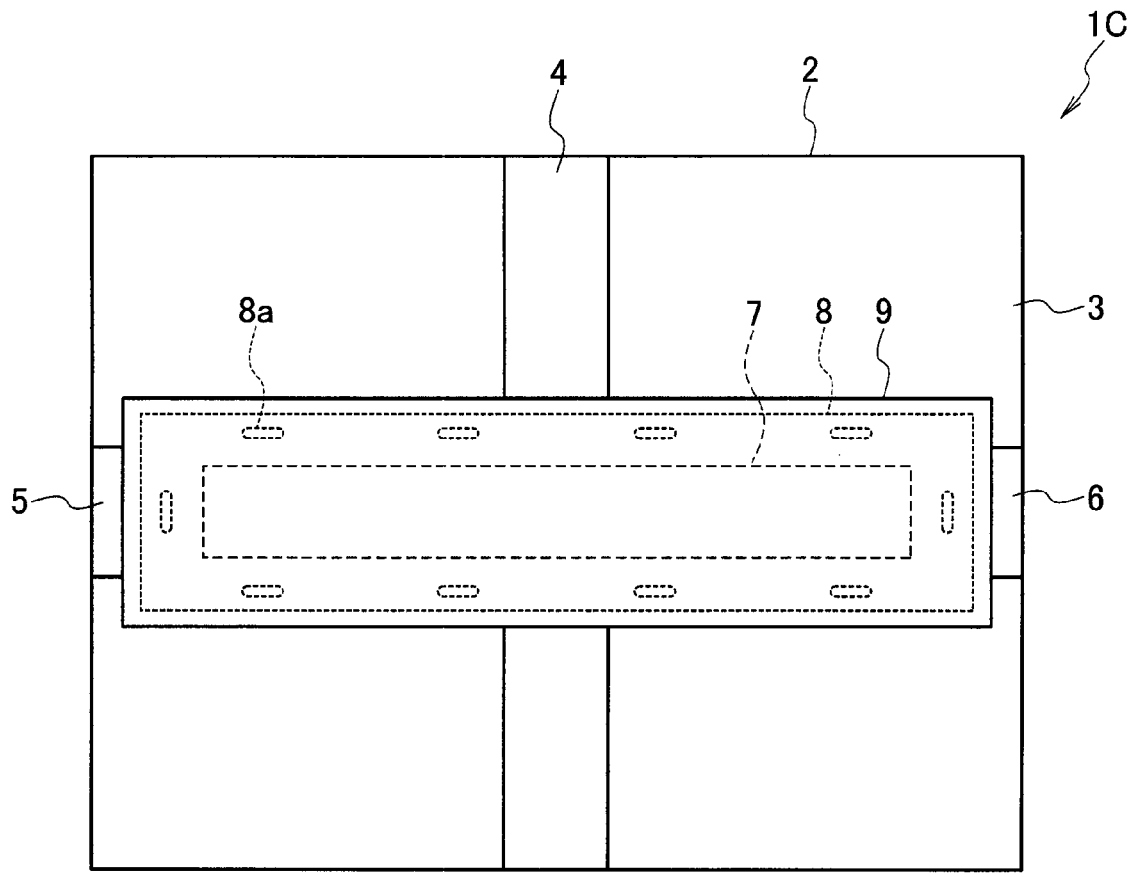
FIG. 14 is a plan view showing a schematic configuration of an electric component according to a second embodiment of the present invention.

As shown in FIG. 14, in an electric component 1C according to the second embodiment of the present invention, the first sealing body 8 is formed into a rectangular planar shape. Each of the apertures 8a is located at a separation distance L1 (see FIG. 3) from the opposite region Ra. Moreover, the apertures 8a are each formed in an elongated shape along an outer periphery of the first sealing body 8, that is, an elongated aperture shape, or slit shapes, for example, along the boundary between the first sealing body 8 and the substrate 2 or along a tangent of the boundary. Here, each of the apertures 8a is provided such that the longitudinal direction thereof is set substantially parallel to the outer periphery of the first sealing body 8, i.e. such that a direction of a tangent of a curved line representing the outer periphery (the contour) of the first sealing body 8 is parallel to the longitudinal direction of the slit. In other words, the slits are each formed into an annular shape as follows. Firstly, here, prepared are two similar or identical lines which are disposed in parallel to, but at different distances from, the boundary between the wall H1 of the first sealing body 8 and the substrate 2 or a tangent of the boundary. Then, these two lines are united to close a space therebetween at two points at a predetermined distance in the direction of boundary so as to form each slit with the annular shape.

Figure 15:
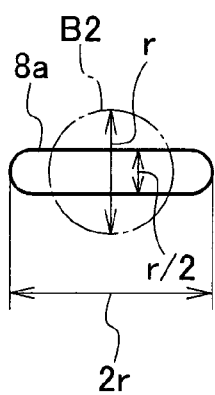
FIG. 15 is a view for explaining a size of an aperture of a first sealing body included in the electric component shown in FIG. 14.

As shown in FIG. 15, a width in the short side direction of the aperture 8a having the slit shape is set to r/2 which is ½ of a diameter r of a precise circle B2 (indicated with a chain line in FIG. 15). Meanwhile, a width in the longitudinal direction thereof is set to 2r which is twice the diameter r of the precise circle B2. Here, the precise circle B2 shown in FIG. 15 represents a comparative example of the first sealing body when the aperture 8a is formed into the circular shape. In this case, the aperture area of the aperture 8a is substantially equal to the area of the precise circle B2.

Figure 17:
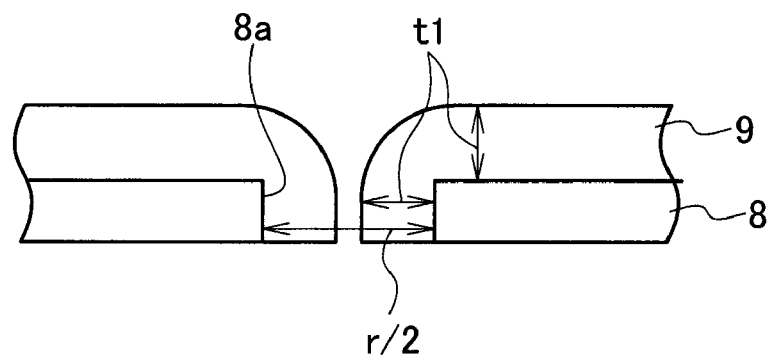
FIG. 17 is a view showing a second step.
Figure 18:
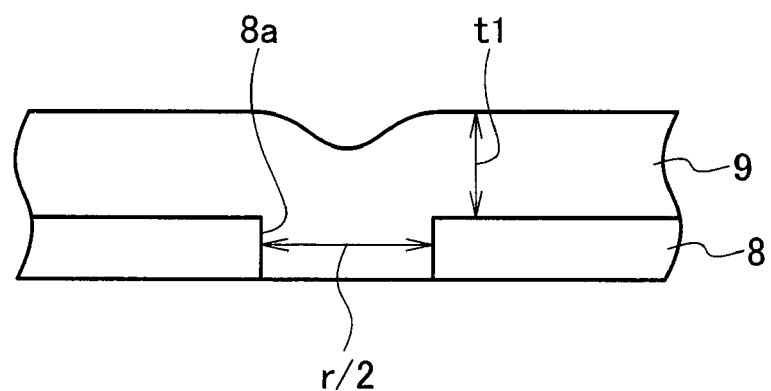
FIG. 18 is a view showing a third step.

Next, a step (a process) for occluding the apertures 8a will be described with reference to FIGS. 16 to 18. In this step, the multiple apertures 8a are occluded substantially at the same time by the second sealing body 9.

Figure 16:
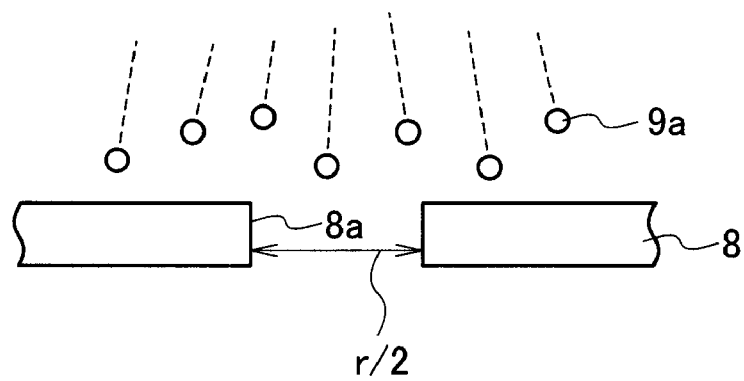
FIG. 16 is a view showing a first step for explaining a process to occlude the aperture.

In the step of occluding the apertures 8a by the second sealing body 9, as shown in FIG. 16, a film material 9a for forming the second sealing body 9 is vapor-deposited on the first sealing body 8 by the CVD, for example. At this time, as shown in FIG. 17, the film material 9a is deposited on the surface of the first sealing body 8 and on the inner wall of the aperture 8a substantially at the same rate and a thickness t1 of the second sealing body 9 is gradually increased. Finally, as shown in FIG. 18, the thickness t1 of the second sealing body 9 becomes equal to or above r/4 (which is a half of the width r/2 in the short side direction) and the aperture 8a is therefore occluded completely. That is, in order to occlude the aperture 8a completely, the thickness t1 of the second sealing body 9 needs to be equal or more the half of the width r/2 in the short side direction of the aperture 8a. Here, an aspect ratio representing a ratio between the long side and the short side of the aperture 8a in the slit shape is set to 4:1 or greater.

Here, in order to reduce the process time for removing the sacrificial layers 11 and 12, it is possible to increase an etching rate by enlarging the aperture 8a and introducing a large amount of the etching material for removing the sacrificial layers. Nevertheless, if the aperture 8a is simply enlarged, it is necessary to form the second sealing body 9 in the thickness equal to or above the half of the diameter (an aperture distance) of the aperture 8a in the process to occlude the aperture 8a. As a consequence, the process time for occluding the aperture 8a is increased.

Therefore, the elongated slit shape of the aperture 8a results in a shorter aperture distance of the aperture 8a than the aperture having the precise circle shape, for example. Accordingly, the thickness t1 of the second sealing body 9 required for occluding the aperture 8a is reduced. In this way, it is possible to reduce the process time for occluding the aperture 8a. Moreover, it is possible to reduce the process time for occluding the aperture 8a without changing the aperture area of the aperture 8a, i.e. without changing the amount of introduction of the etching material for removing the sacrificial layers. Accordingly, it is also possible to prevent extension of the process time for removing the sacrificial layers 11 and 12. In this way, it is possible to achieve reduction in the manufacturing time by applying the aperture 8a having the slit shape. Further, it is also possible to increase the aperture area by means of extending the aperture 8a in the longitudinal direction without the need of increasing the process time for occluding the aperture 8a. Accordingly, it is possible to reduce the process time for removing the sacrificial layers 11 and 12.

Meanwhile, when a material exhibiting a relatively large thermal expansion, such as an organic material, is used for the material of the sacrificial layers 11 and 12, a stress concentrates on the vicinity of the aperture 8a of the first sealing body 8 after the aperture forming process of the first sealing body 8 and in the course of removing the sacrificial layers because of a difference in the thermal expansion between the sacrificial layer 12 and the first sealing body 8 formed thereon. This stress is equivalent to a tensile characteristic in a direction parallel to a part of the contour of the first sealing body 8, the part being closer to the aperture 8a. In this case as well, it is possible to suppress the concentration of the stress by forming the aperture 8a into the elongated shape such as the slit shape and locating the long side of the slit parallel to a tensile direction of the stress. Accordingly, it is possible to achieve a favorable stress characteristic of the first sealing body 8 that occurs in the above-described manufacturing process. In this way, it is possible to avoid defects such as cracks or breakage on the first sealing body 8 occurring in the manufacturing process, and thereby to manufacture the electric component 1C stably.

As described above, according to the second embodiment of the present invention, the apertures 8a are formed into the elongated shapes along the outer periphery of the first sealing body 8, i.e. into the elongated aperture shapes along the boundary between the first sealing body 8 and the substrate 2 or along the tangent of the boundary. Therefore, the aperture distance of the aperture 8a becomes narrower as compared to the apertures in other shapes having the same area such as the aperture having the precise circular shape, and the thickness t1 of the second sealing body 9 required for occluding the aperture 8a becomes thinner. In this way, it is possible to reduce the process time for occluding the aperture 8a, and thereby to reduce the manufacturing time for the electric component 1C.

In particular, the slit shape, i.e., an annular shape of the apertures 8a for removing the sacrificial layers makes it possible to reduce the process time for the occlusion reliably as compared to the cases of other shapes having the same area. The annular shape is formed as follows. Firstly, prepared are two similar or identical lines which are disposed in parallel to, but at different distances from. Then, these two lines are united to close a space therebetween at two points at a predetermined distance in the direction of boundary. For example, by forming the aperture 8a into the slit having the same area as the precise circular shape while reducing the short side width of the slit to half of the diameter of the precise circle, it is possible to reduce the process time for occlusion by half. Moreover, each of the apertures has the same area and it is therefore possible to have the approximately same amount of introduction of the etching material for removing the sacrificial layers. Accordingly, it is possible to remove the sacrificial layers with almost no change in the etching time.

Further, by forming a tip end of the aperture 8a having the slit shape into a round shape, it is possible to reduce the stress generated in the vicinity of the tip end of the aperture 8a in the process for forming the aperture on the first sealing body 8 and in the subsequent process for removing the sacrificial layers. Moreover, it is possible to reduce concentration of the stress after the aperture forming process until the sacrificial layer removing process by disposing the slit-shaped apertures 8a parallel to the contour shape of the first sealing body 8. In addition, by setting the aspect ratio of the long side to the short side of the slit-shaped apertures 8a to 4:1 or greater, it is possible to improve effect of reducing the stress in the vicinity of the slits during the manufacturing process. By these effects, it is possible to reduce defects such as cracks or breakage on the first sealing body 8 occurring in the manufacturing process, and thereby to manufacture the electric component 1C stably.

Third Embodiment

A third embodiment of the present invention will be described with reference to FIGS. 19 to 22.

Basically, the third embodiment of the present invention is similar to the first embodiment. Therefore, different features from those in the first embodiment will be described in the third embodiment. Moreover, in the third embodiment, explanation of the same constituents as those described in the first embodiment and the second embodiment will be omitted.

Figure 19:
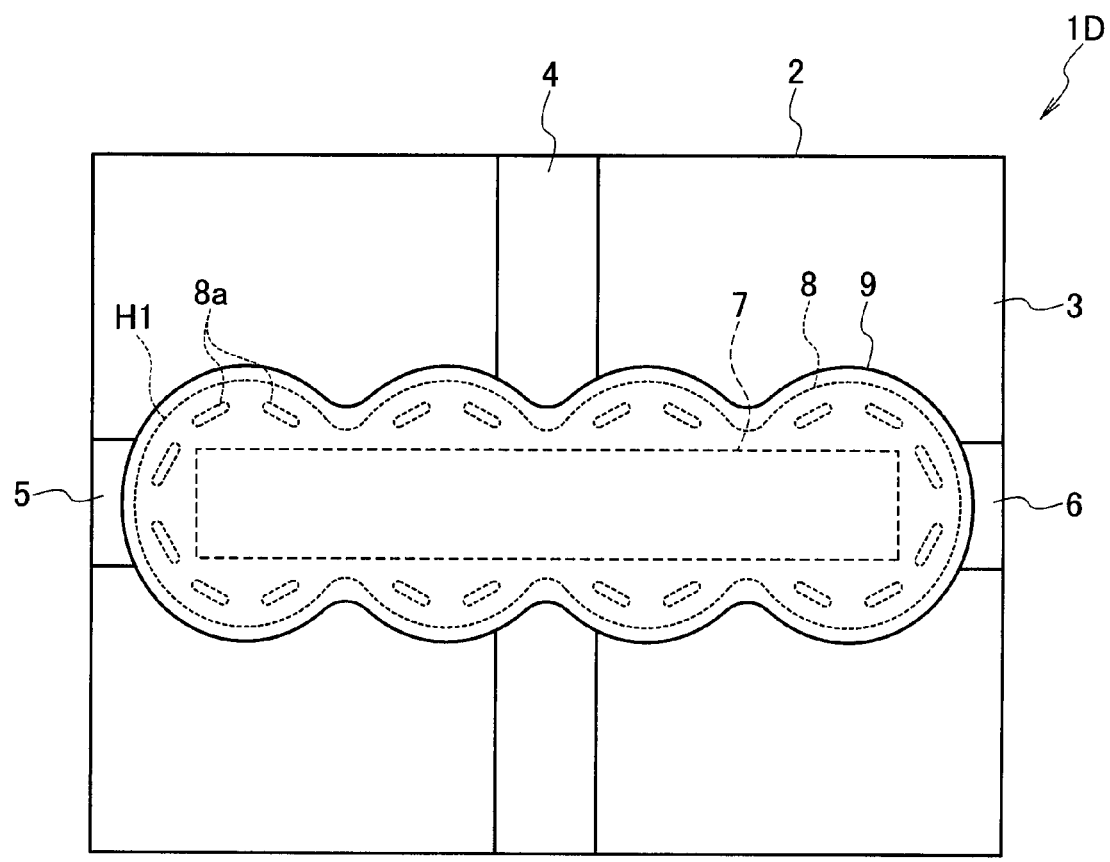
FIG. 19 is a plan view showing a schematic configuration of an electric component according to a third embodiment of the present invention.

As shown in FIG. 19, apertures 8a according to the second embodiment are formed in an electric component 1D according to the third embodiment of the present invention. Specifically, the wall H1 of the first sealing body 8 according to the first embodiment and the apertures 8a according to the second embodiment are combined in this embodiment. Moreover, each of the center points of the apertures 8a is located at a certain separation distance from the opposite region Ra.

As described above, according to the third embodiment of the present invention, it is possible to obtain effects similar to the first embodiment, and moreover, to obtain effects similar to the second embodiment. Therefore, by combining the wall H1 of the first sealing body 8 according to the first embodiment with the apertures 8a according to the second embodiment, it is possible to reduce the process time for occluding the apertures 8a and to reduce the process time for removing the sacrificial layers 11 and 12. Accordingly, it is possible to further reduce the manufacturing time for the electric component 1D as compared to the first embodiment and the second embodiment.

Figure 20:
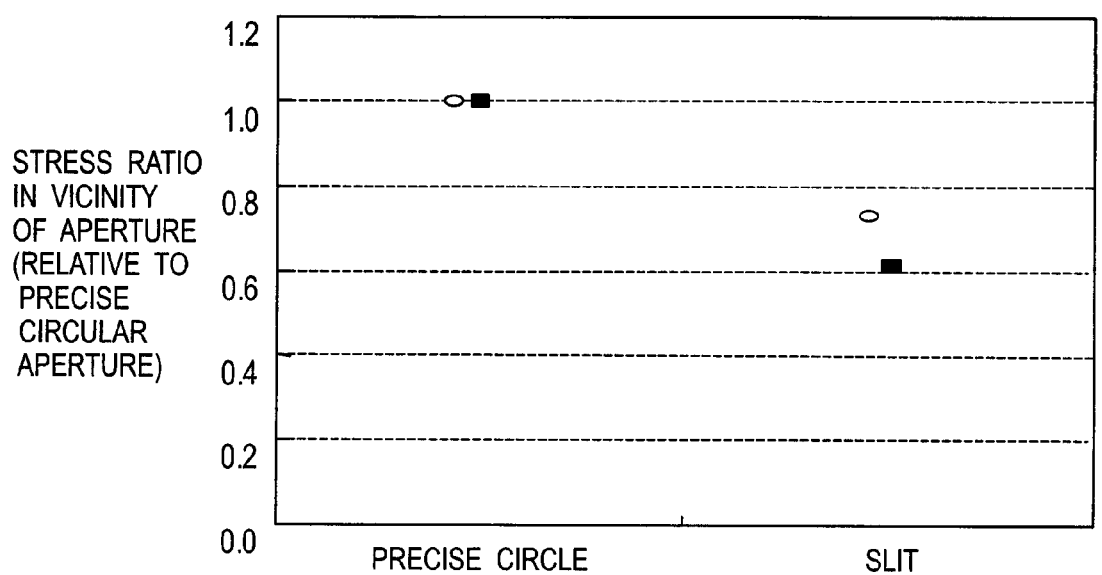
FIG. 20 is a view for explaining a simulation result of a stress characteristic of a sealing structure according to the third embodiment of the present invention.

Now, the stress characteristic after the aperture forming process on the first sealing body 8 and during the sacrificial layer removing process in the case of applying the slit-shaped apertures 8a to the sealing structure having the constrictions K1 will be simulated. Results are shown in FIG. 20. FIG. 20 shows the stress ratios in the vicinity of the aperture of each of the sealing structures having the apertures in different shapes. White dots in the graph show the results after the aperture forming process and black dots show results during the removal of the sacrificial layers. Specifically, the stress ratio is shown: a maximum principal stress in the case of the sealing structure (precise circle: see FIG. 1) having the apertures 8a in the precise circular shape versus a maximum principal stress in the case of the sealing structure (slit: see FIG. 19) having the apertures 8a in the slit shape. Here, the stresses of the sealing structure including the apertures 8a having the precise circular shape are defined as 1 in both the conditions after the aperture forming process and during the removal of the sacrificial layers. Moreover, the slit-shaped aperture 8a is formed into the slit shape having the semicircular tip ends, the long side equal to 2r, the short side equal to r/2, and the aspect ratio of 4:1. Further, each of the apertures 8a is disposed such that the long side of the slit is parallel to the direction of the tangent of the curved line representing the outer periphery (the contour) of the first sealing body located near.

The simulation is carried out under the condition that the internal space (the hollow) N1 of each of the sealing films is set to vacuum and the pressure difference of about 0.1 kPa relative to the atmosphere is applied to the inner wall of the sealing film. Meanwhile, the sealing films of the shape examples are made of the same material, and have the same thickness and sealing heights.

As a result of this simulation, it is apparent that the stress on the sealing structure (slit) having the slit-shaped apertures 8a is reduced by 20% or more as compared to the stress on the sealing structure (precise circle) having the apertures 8a in the precise circular shape. In this way, it is possible to suppress the stress during the manufacturing process by: forming the apertures 8a into the slit shape having the aspect ratio of 4:1; and disposing these apertures 8a so that the slit longitudinal direction of each aperture 8a can be in parallel to the direction of a tangent of the curved line, which is close to the aperture 8a, representing the contour of the first sealing body 8. Accordingly, it is possible to improve the manufacturing yield.

Lastly, modified example of the shape of the wall H1 of the first sealing body 8 will be described with reference to FIGS. 21 and 22. Note that the chain line B1 illustrated in FIGS. 21 and 22 shows the first sealing body of the comparative example having the rectangular planar shape.

Figure 21:
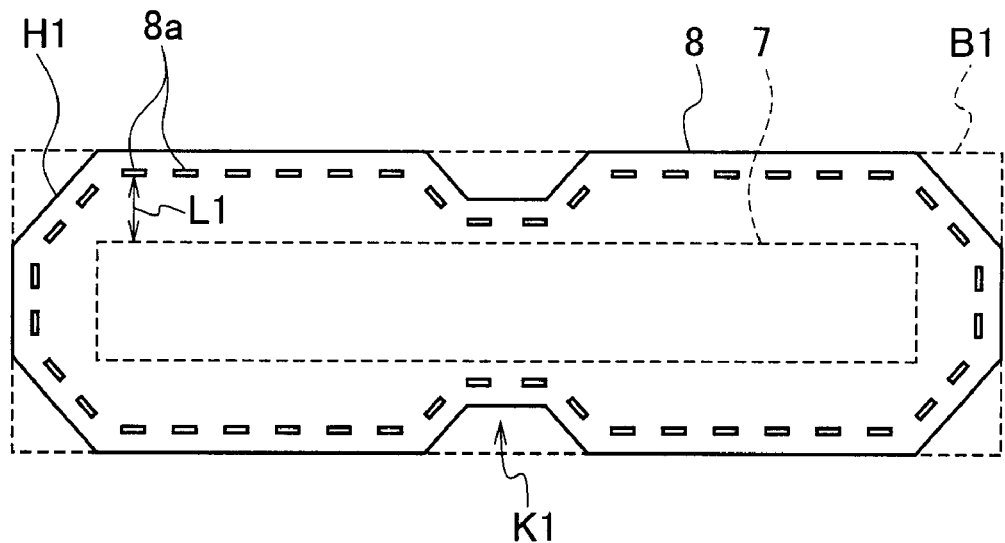
FIG. 21 is a plan view showing a first sealing body of a fifth modified example.

As shown in FIG. 21, in the first sealing body 8 of a fifth modified example, the curved shape of the wall H1 forming the constrictions K1 is a complex of straight lines unlike the continuous curve shown in FIG. 19. Specifically, in terms of the planar shape of the first sealing body 8, both long side and short side of the first sealing body 8 are formed into a complex of straight lines. Therefore, the first sealing body 8 is formed into a shape of a chamfered rectangle. Moreover, the apertures 8a are formed into a rectangular shape.

Figure 22:
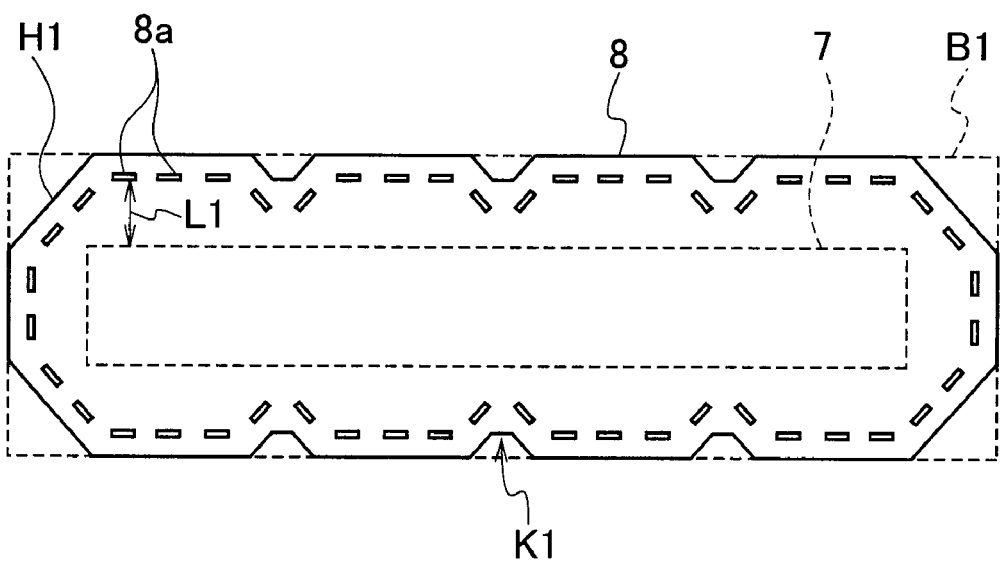
FIG. 22 is a plan view showing a first sealing body of a sixth modified example.

As shown in FIG. 22, in the first sealing body 8 of a sixth modified example, the number of the constrictions K1 in the long side direction is increased from one piece to three pieces as compared to FIG. 21. In this sixth modified example, since the number of the constrictions K1 in the long side direction is increased from one piece to three pieces as compared to FIG. 21, the first sealing body 8 has a greater reduction effect for reducing deformation such as flexure.

As described above, the curved shape (the boundary) of the wall H1 for forming the constrictions K1 may be formed by the complexes of straight lines as shown in FIGS. 21 and 22, the continuous curved lines as shown in FIGS. 3, 8, and 9, or the combinations of curved lines and straight lines as shown in FIGS. 10 and 11.

Other Embodiments

The present invention is note limited only to the above-described embodiments and various other modifications are possible without departing from the scope of the invention.

For example, although a movable piece is used for the function element 7 in the above-described embodiments, the present invention will not be limited only to this configuration.

Moreover, in the above-described embodiments, the function element 7 is provided on the substrate 2 in the bead structure supported at both ends thereof fixed to the pair of conductors 5 and 6. However, the present invention will not be limited only to this configuration. For example, the function element 7 may be provided on the substrate 2 in a bead structure supported at one end thereof fixed to any one of the conductors 5 and 6.

Lastly, although various numerical values are quoted in the above-described embodiments, those numerical values are merely examples and are not limited to the values expressly stated therein.

What is claimed is:

1. An electric component comprising:
a substrate having a flat surface;
a function element provided on the substrate;
a first sealing body provided on the flat surface of the substrate to cover the function element at a certain distance, the first sealing body including a plurality of apertures communicating with an internal space formed between the first sealing body and the substrate; and
a second sealing body provided on the first sealing body and configured to occlude the plurality of apertures,
wherein a side wall of the first sealing body and a side wall of the second sealing body are curved in a direction to narrow the internal space.

2. The electric component according to claim 1,
wherein the side wall of the first sealing body comprises at least one constriction in a longitudinal direction of the first sealing body, and the side wall of the second sealing body comprises at least one constriction in a longitudinal direction of the second sealing body.

3. The electric component according to claim 1,
wherein the side wall of the first sealing body is formed into an undulated shape in a longitudinal direction of the first sealing body, and the side wall of the second sealing body is formed into an undulated shape in a longitudinal direction of the second sealing body.

4. An electric component comprising:
a substrate
a function element provided on the substrate;
a first sealing body provided on the substrate to cover the function element at a certain distance, the first sealing body having a plurality of apertures communicating with an internal space formed between the first sealing body and the substrate; and
a second sealing body provided on the first sealing body and configured top occlude the plurality of apertures, wherein
each of the apertures is formed into an elongated aperture shape along any of a boundary between the first sealing body and the substrate, and a tangent of the boundary, and
each of the apertures is formed into an annular shape in a way that two similar or identical lines are united to close a space therebetween at two points at a predetermined distance in the direction of the boundary, the two lines being disposed in parallel to, but at different distances from, any one of the boundary and a tangent of the boundary.

* * * * *